(12) United States Patent
Kang

(10) Patent No.: US 8,737,082 B2
(45) Date of Patent: May 27, 2014

(54) INTERLOCKING SYSTEM FOR SECURING A PRINTED CIRCUIT BOARD

(75) Inventor: Soon Seng Kang, Singapore (SG)

(73) Assignee: Rockwell Automation Asia Pacific Business Center Pte. Ltd., Singapore (SG)

(*) Notice: Subject to any disclaimer, the term of this patent is extended or adjusted under 35 U.S.C. 154(b) by 217 days.

(21) Appl. No.: 13/222,505

(22) Filed: Aug. 31, 2011

(65) Prior Publication Data

US 2012/0057319 A1 Mar. 8, 2012

(30) Foreign Application Priority Data

Sep. 1, 2010 (SG) ................. 201006354-3

(51) Int. Cl.
*H05K 5/00* (2006.01)
*G06F 1/18* (2006.01)

(52) U.S. Cl.
CPC ............... *G06F 1/186* (2013.01); *G06F 1/184* (2013.01); *G06F 1/185* (2013.01)
USPC ............................ 361/752; 361/748; 361/759

(58) Field of Classification Search
CPC ............................................. G06F 1/184–1/186
USPC ......................................... 361/748, 752, 759
See application file for complete search history.

(56) References Cited

U.S. PATENT DOCUMENTS 5,689,405 A * 11/1997 Bethurum ................... 361/737
6,183,294 B1 2/2001 Fan et al.

FOREIGN PATENT DOCUMENTS

DE 3335820 A1 * 4/1985 ............... H05K 7/14
WO 0051206 8/2000

OTHER PUBLICATIONS

Search Report & Written Opinion by the Hungarian Patent Office for Singapore Application No. 201006354-3 mailed May 3, 2012.
Examination Report by the Hungarian Patent Office for Singapore Application No. 201006354-3 mailed Feb. 1, 2013.

* cited by examiner

*Primary Examiner* — Ramon Barrera
(74) *Attorney, Agent, or Firm* — Fletcher Yoder, P.C.

(57) ABSTRACT

An electronic component and housing interlocking system is provided. The system includes a device housing configured to hold a printed circuit board. The printed circuit board includes a projection from a side of the printed circuit board. The system also includes a locking member having a tab coupled at a first end of the tab to a side wall of the device housing and free at a second end of the tab such that the tab is configured to flex about the first end when the printed circuit board is slid into the device housing and the projection is pushed against the second end of the tab. The tab includes an opening configured to receive the projection after being slid past the second end such that the tab engages the printed circuit board within the device housing in a locked position.

22 Claims, 5 Drawing Sheets

INTERLOCKING SYSTEM FOR SECURING A PRINTED CIRCUIT BOARD

CROSS REFERENCE TO RELATED APPLICATIONS

This application claims priority from and the benefit of Singapore Patent Application No. 201006354-3, filed on Sep. 1, 2010; entitled "Interlocking System for Securing a Printed Circuit Board", which is herein incorporated by reference.

BACKGROUND

The invention relates generally to printed circuit boards, such as those used in components of industrial automation and control systems. More particularly, embodiments of the present invention relate to techniques for securing a printed circuit board with a related device housing.

Industrial automation and control systems are known and are in use for controlling factory automation and the like. Such systems include various components such as programmable logic controllers, semiconductor power electronic circuits, power supplies, motor starters, relays, and so forth that are utilized to monitor and control a process/system. Typically, in operation, the programmable logic controller examines a series of inputs reflecting the status of a controlled process and changes outputs affecting control of the controlled process.

In general, components such as programmable logic controllers, input/output modules, and the like often utilize one or more printed circuit boards. Typically, these printed circuit boards include power modules which house electrical devices such as resistors and semiconductors, logic or customer interface circuit boards (e.g., motherboards) which house microprocessors or other logic devices for performing control functions, and storage or capacitor circuit boards which house charge storage devices and direct current (DC) power busses. Each of the various types of circuit boards typically supports components and conducting paths for accomplishing various functions in an associated completed device.

In traditional automation and control systems, various system components, such as controllers and input/output modules include a printed circuit board within a housing of the system component. The printed circuit board is typically inserted within the housing during assembly of the system component, and may be removed for maintenance or the like. It is now recognized that traditional arrangements and configurations of features of a printed circuit board and/or device housing can lead to damage to the housing based on actions taken during insertion and/or removal of the printed circuit board.

BRIEF DESCRIPTION

According to one embodiment of the present invention, an electronic component and housing interlocking system is provided. The system includes a device housing configured to hold a printed circuit board. The printed circuit board includes a projection from a side of the printed circuit board. The system also includes a locking member having a tab coupled at a first end of the tab to a side wall of the device housing and free at a second end of the tab such that the tab is configured to flex about the first end when the printed circuit board is slid into the device housing and the projection is pushed against the second end of the tab. The tab includes an opening configured to receive the projection after being slid past the second end such that the tab engages the printed circuit board within the device housing in a locked position.

In accordance with another aspect, an electronic device system is provided. The system includes a device housing and a printed circuit board within and extending along a length of the device housing. The printed circuit board includes a first extension from a first edge of the printed circuit board and a second extension from a second edge of the printed circuit board. The system also includes a first locking member disposed on a first side wall and a second locking member disposed on a second side wall of the device housing. The first and second locking members are configured to bend about one end to engage with the first and second extensions, respectively.

In accordance with another aspect, a method of securing a printed circuit board to a device housing is provided. The method includes slidably inserting the printed circuit board within the housing through an opening in a top of the housing and securing an attachment feature cantilevered from a side of the printed circuit board with a tab cantilevered from a side wall of the device housing by flexing the tab out as a result of pressing the attachment feature against an upper portion of the tab until the attachment feature slides past the upper portion and engages with an opening in the tab.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

It is now recognized that traditional automation and control system modules that include a housing configured to receive a printed circuit board are typically prone to damage to the housing as a result of removal and/or insertion of the printed circuit board. Indeed, it is now recognized that the entire housing of a traditional system module is caused to deform during insertion and removal of a printed circuit board, which leads to damage. Accordingly, as discussed in detail below, embodiments of the present technique function to provide an interlocking system for securing an electronic component, such as a printed circuit board of an electronic device, within a device housing that includes a locking member configured to flex such that remaining portions of the device housing remain substantially stable during insertion and/or removal of the electronic component. In particular, the present technique provides locking members configured to flex open during insertion and/or removal of a printed circuit bard, and to secure the printed circuit board within the device housing while preventing accidental opening of such locking members during operation of such systems.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
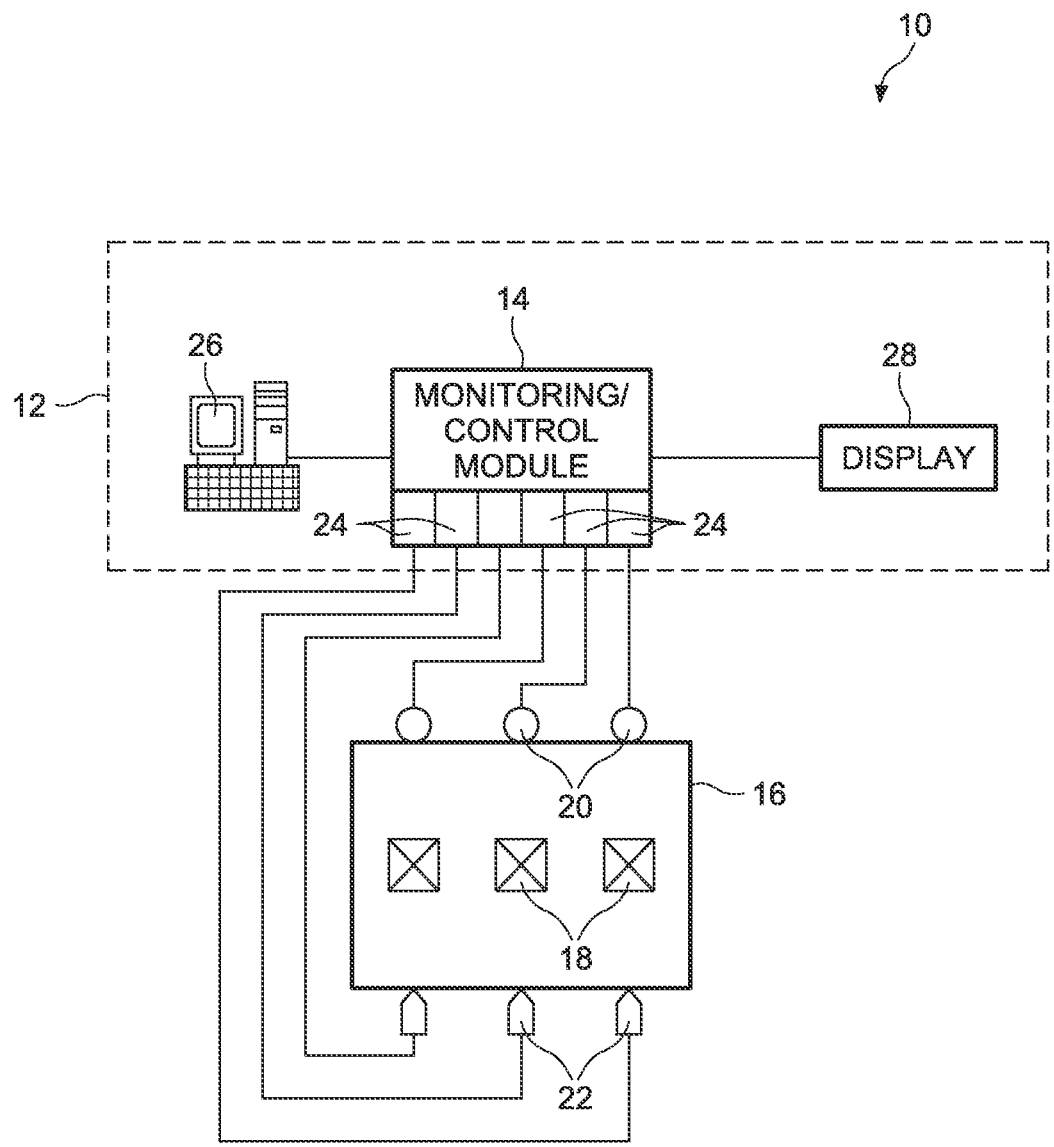
FIG. 1 is a block diagram that illustrates an exemplary industrial automation and control system including a module in accordance with aspects of the present technique.

Turning now to the drawings and referring first to FIG. 1 an exemplary industrial automation and control system 10 is illustrated. The system 10 includes an enclosure 12, such as an electrical cabinet, in which electrical components such as monitoring and/or control components are housed. Example components in the unit may include relays, motor starters, and programmable logic controllers (PLC), among others.

The enclosure 12 may be suitable, for example, for assembly of a motor control center or use with industrial, commercial, marine, or other electrical systems. The enclosure 12 may be made of any suitable material, such as heavy gage sheet metal, reinforced plastics, and so forth. In certain embodiments, the enclosure 12 includes individual compartments or other structures that support the electrical components.

In the illustrated embodiment, the system 10 includes a monitoring/control module 14 assembled in accordance with present techniques and adapted to interface with components of a machine system/process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process/system 16 may take many forms and include devices for accomplishing many different and varied purposes. For example, the process/system 16 may comprise a compressor station, an oil refinery, a batch operation for making food items, a mechanized assembly line, and so forth. Accordingly, the process/system 16 may comprise a variety of operational components generally represented by reference numeral 18, such as electric motors, valves, actuators, temperature elements, pressure sensors, or a myriad of manufacturing, processing, material handling and other applications.

Further, the process/system 16 may comprise control and monitoring equipment for regulating process variables through automation and/or observation. For example, the illustrated process/system 16 comprises sensors 20 and actuators 22. The sensors 20 may comprise any number of devices adapted to provide information regarding process conditions. The actuators 22 may include any number of devices adapted to perform a mechanical action in response to an input signal.

As illustrated, these sensors 20 and actuators 22 are in communication with the monitoring/control module 14 (e.g., a programmable logic controller). In one embodiment, the sensors 20 and actuators 22 may communicate with the monitoring/control module 14 via one or more I/O modules 24 coupled to the monitoring/control module 14. The I/O modules 24 may transfer input and output signals between the monitoring/control module 14 and the controlled process/system 16.

In certain embodiments, these devices (sensors 20 and actuators 22) may be utilized to operate process equipment. Indeed, they may be utilized within process loops that are monitored and controlled by the process/system 16. Such a process loop may be activated based on process inputs (e.g., input from a sensor 20) or direct operator input received through a user interface device 26.

The I/O modules 24 may be integrated with the control/monitoring device 14, or may be added or removed via expansion slots, bays or other suitable mechanism. For example, to add functionality to the control/monitoring device 14, additional I/O modules 24 may be added, such as if new sensors 20 or actuators 22 are added to control the process/system 16. These I/O modules serve as an electrical interface to the controller and may be located proximate or remote from the controller including remote network interfaces to associated systems.

The I/O modules 24 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O modules 24 may convert between AC and DC analog signals used by devices on a controlled machine or process and +5-volt DC logic signals used by the controller. Additionally, some of the I/O modules 24 may provide digital signals to digital I/O devices and receive digital signals from digital I/O devices. Further, in some embodiments, the I/O modules 24 that are used to control motion devices or process control devices may include local microcomputing capability on the I/O module 24.

In some embodiments, the I/O modules 24 may be located in close proximity to a portion of the control equipment, and away from the remainder of the controller. Data is communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet, or other network protocols (Foundation Fieldbus (H1 and Fast Ethernet) Modbus TCP, Profibus) and also communicate to higher level computing systems In the illustrated embodiment, the system 10 also includes a display 28 such as an LCD or other display. The display 28 is configured to display output parameters such as operating parameters of the process/system 10, temperature and pressures sensed by the sensors 20, position information of the actuators 22 and so forth.

In the illustrated embodiment, the individual modules such as the monitoring/control module 14 and the input/output modules 24 include a device housing configured to hold printed circuit boards that house microprocessors or other logic devices configured to perform control and other desired functions. The printed circuit board is secured to the device housing using an interlocking system in accordance with present techniques. In particular, the interlocking system includes a plurality of locking members coupled to the device housing of the monitoring/control modules that engage with a corresponding attachment feature disposed on the printed circuit board as will be described below with reference to FIGS. 2-6.

Figure 2:
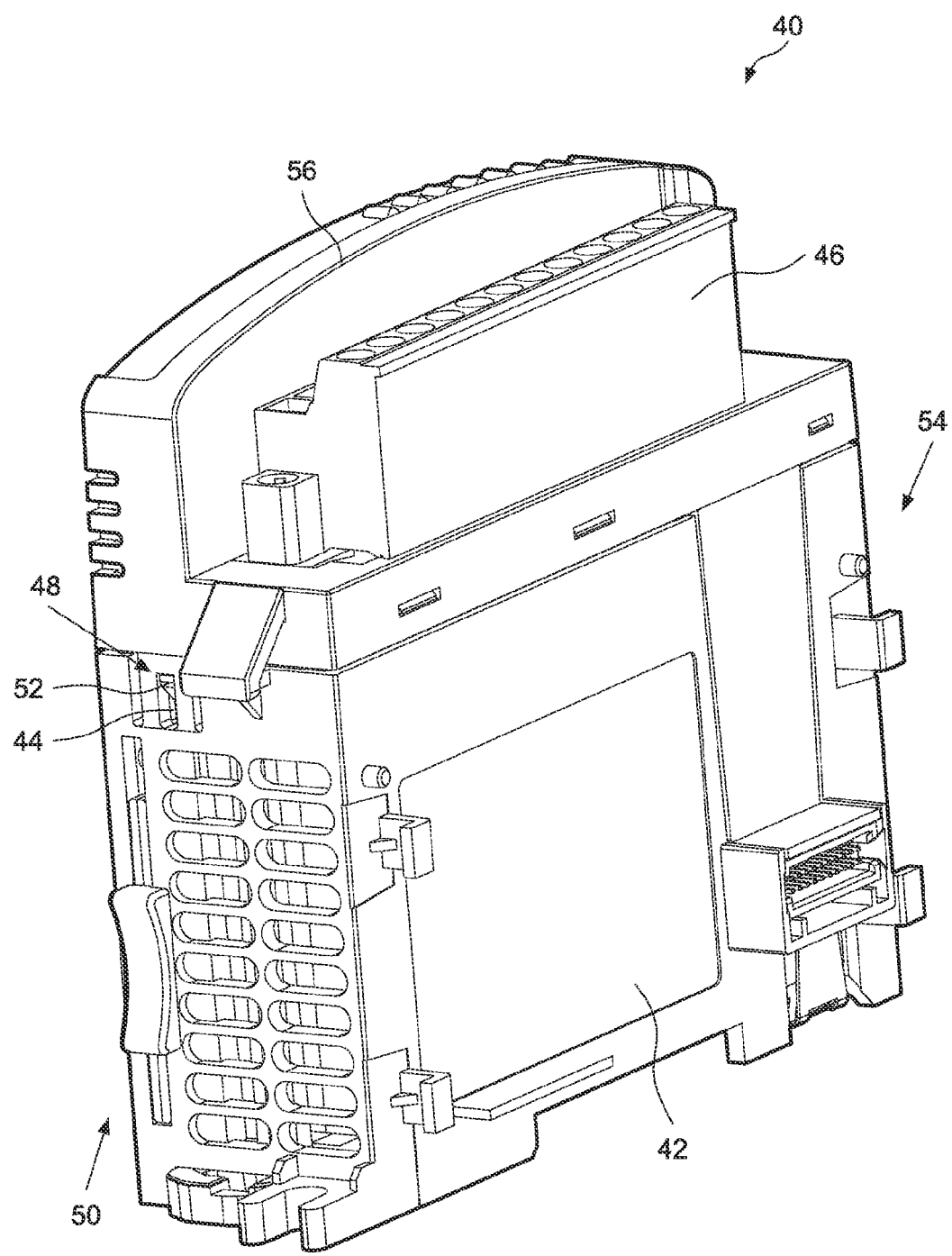
FIG. 2 illustrates an assembled perspective view of an individual module such as the monitoring/control module of FIG. 1.

FIG. 2 illustrates an assembled perspective view of an individual module 40 such as the monitoring/control module 14 of FIG. 1. As illustrated, the module 40 includes a device housing 42 configured to hold a printed circuit board 44 (e.g., a motherboard). The printed circuit board 44 may include electrical devices such as resistors and semiconductors. Further, for example, the printed circuit board 44 may include logic or user-interface circuit boards, which include microprocessors or other logic devices for performing control and/or monitoring functions. The printed circuit board 44 may include a connector coupled to the printed circuit board 44. The connector is configured to facilitate signal transmission between electrical components of the module 40, such as components on the printed circuit board 44 and a removable terminal block 46, and to facilitate securing of the printed circuit board 44 within the device housing 42.

As illustrated, the module 40 also includes one or more locking members 48 coupled with (e.g., formed on, attached to, or integral with) a side wall 50 of the device housing 42. The locking member 48 is configured to engage with a corresponding attachment feature, as indicated by reference numeral 52, of the printed circuit board 44. Indeed, in the illustrated embodiment, the printed circuit board 44 is disposed within the device housing 42 and the attachment feature 52 is extending from the printed circuit board 44 into an opening within the locking member 48. The locking member 48 is formed of a flexible material and is configured to bend about one end upon insertion of the printed circuit board 44 to engage with the attachment feature 52 of the printed circuit board. For example, the locking member 48 may flex about the end of the locking member 48 that is directly coupled to the side wall 50 when the other end of the locking member 48 is pushed by the attachment feature 52 upon insertion of the printed circuit board 44 into the device housing 42. The locking member 48 may flex back into place once the attachment feature 52 engages the opening in the locking member 48.

As illustrated, the attachment feature 52 is cantilevered from a body of the printed circuit board 44 and may have different shapes to facilitate engagement with the locking member 48. For example, an edge of the attachment feature 52 may be sloped such that insertion of the printed circuit board 44 into the housing 42 causes the attachment feature 52 to gradually push the locking member 48 further out until the attachment feature 52 slides into an opening in the locking member 48. Similarly, the locking member 48 may include different shapes and configurations to facilitate locking engagement with the attachment feature 52. For example, a cross-section of the locking member 48 may be sloped or angled such that the cross-section gets thicker towards the point where the locking member 48 couples with the side wall 50. The outer surface of the locking member 48 may be substantially straight and the sloping may be on the inner surface of the locking member 48 such that it facilitates sliding of the attachment feature 52 along the inner surface of the locking member 48 upon insertion of the printed circuit board into the device housing 42.

Further, the locking member 48 may include different shapes of openings and/or indentations configured to receive or engage the attachment feature 52. In certain exemplary embodiments, the module 40 includes additional locking members coupled on an opposite side wall 54 of the device housing 42. Further, in some embodiments, a plurality of such locking members 48 may be disposed on the side walls of the device housing 42, each of such locking members 48 being configured to engage with a corresponding attachment feature 52 of the printed circuit board 44.

Figure 3:
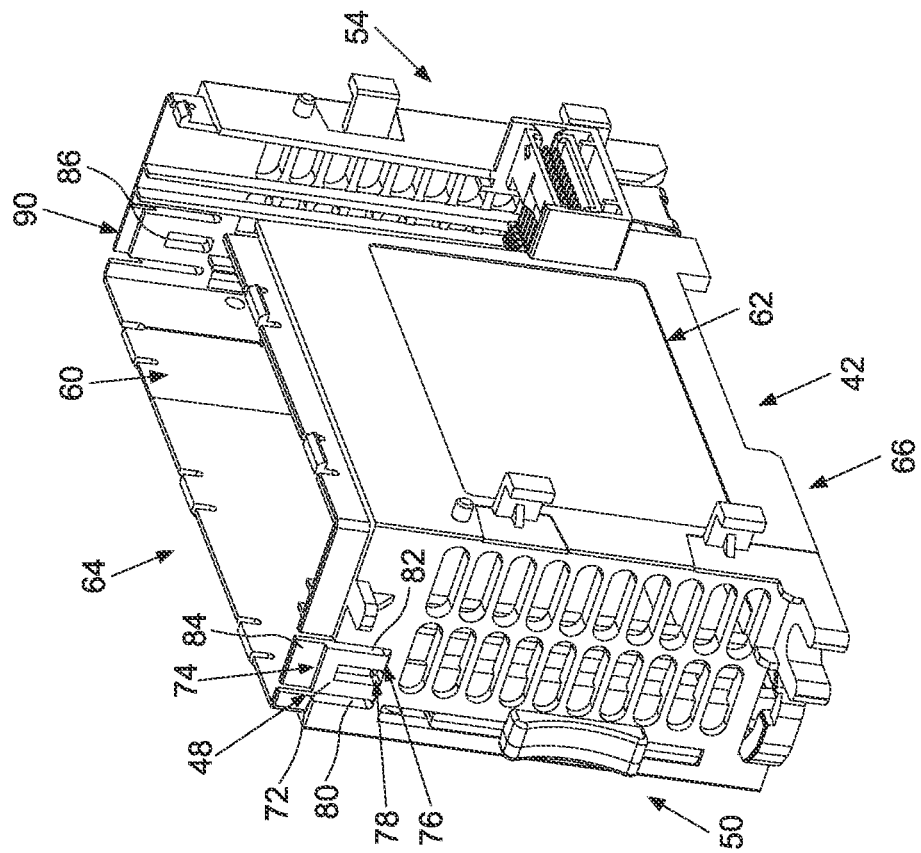
FIG. 3 illustrates an exemplary configuration of a device housing with a locking member for securing a printed circuit board to the device housing in accordance with aspects of the present technique.

The module 40 also includes a lid 56. The lid 56 may be removed, as illustrated in FIG. 3, to create an opening in the top of the device housing 42 to receive the printed circuit board 44 and the connector. The lid 56 is configured to couple with the device housing 42 such that the lid 56 and the device housing 42 enclose the printed circuit board 44 when positioned within the device housing 42. In this exemplary embodiment, the device housing 42 also includes locking ribs to prevent accidental opening of the locking members 48, as will be described below with reference to FIG. 3.

Figure 4:
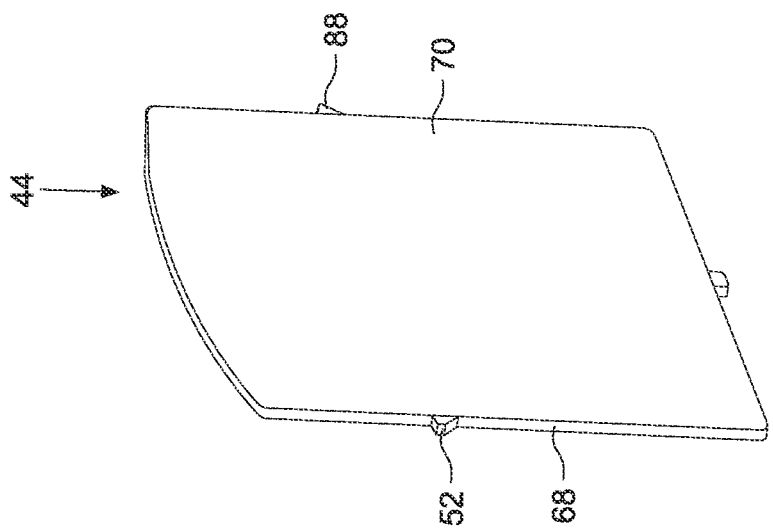
FIG. 4 illustrates exemplary configuration of a printed circuit board with an attachment feature for securing the printed circuit board to the device housing in accordance with aspects of the present technique.

FIGS. 3 and 4 illustrate exemplary configurations of the device housing 42 and the printed circuit board 44 with the locking member 48 and the corresponding attachment feature 52, respectively, for securing the printed circuit board 44 to the device housing 42. As can be seen, the device housing 42 includes a cavity 60 formed by four side walls generally represented by reference numerals 50, 54, 62 and 64 and a base 66. The cavity 60 is configured to slidably receive the printed circuit board 44 at least partially into the cavity 60.

As illustrated, the printed circuit board 44 includes the attachment feature 52, which includes a projection from a side 68 of the printed circuit board 44. In certain embodiments, the projection or attachment feature 52 may be prefabricated and attached to the substrate 70 using an adhesive or a fastener, among other suitable coupling techniques. In the illustrated embodiment, the projection 52 includes an extension of a substrate 70 of the printed circuit board 44. The location of the projection 52 on the printed circuit board 44 may be based upon the corresponding location of the locking member 48 on the device housing 42.

In this exemplary embodiment, the projection 52 has a tapered edge. Specifically, the edge of the projection 52 that contacts the locking member 48 upon insertion of the printed circuit board 44 into the device housing 42 is angled up and away from the main body of the printed circuit board 44. This enables the projection 52 to gradually engage and cause the locking member 48 to flex during insertion of the printed circuit board 44 into the device housing 42. In other embodiments, the projection 52 may be squared, rounded, angled, or some combination thereof. Further, the opposite edge of the projection 52 may be shaped to facilitate removal of the printed circuit board 55. The shape and size of the projection 52 may be appropriately selected to facilitate the engagement of the projection 52 with the locking member 48.

Furthermore, the device housing 42 includes the locking member 48 disposed on the side wall 50 of the device housing 42. In the illustrated embodiment, the locking member 48 includes a tab 72 coupled at a first end 74 of the tab 72 to the side wall 50 of the device housing 42. The tab 72 may be an extension from the side wall 50 or attached to the sidewall 50. The tab 72 is free at a second end 76 such that the tab 72 is configured to flex about the first end 74 when the printed circuit board 44 is slid into the device housing 42 and the projection 52 is pushed against the second end 76 of the tab 72. Similarly, a user can flex the tab 72 about the first end 74 to facilitate removal of the printed circuit board 44.

In the illustrated embodiment, the tab 48 includes an opening 78 configured to receive the projection 52 after being slid past the second end 76 such that the tab 48 engages the printed circuit board 44 within the device housing 42 in a locked position. In some embodiments, the opening 78 may not pass all the way through the tab 72. For example, the opening 78 may include a recess in the tab 72. However, providing an opening that passes all the way through the tab 72 may facilitate confirmation of engagement between the locking member 48 and the projection 52 in accordance with present embodiments.

In this exemplary embodiment, the locking member 48 includes an extension of the side wall 50 with slots 80 and 82 on either side to form the tab 72. It should be noted that the slots 80 and 82 provide substantial flexibility to the locking member 48 to flex about the first end 74 of the side wall 50 without causing substantial deformation of the device housing 42. The locking member 48 and/or the device housing 42 may be formed of nylon, polycarbonate, stainless steel, or combinations thereof. However, other suitable materials may be employed.

In the illustrated embodiment, the device housing 42 also includes a locking rib 84 coupled to the first end 74 of the tab 72. In this exemplary embodiment, the locking rib 84 is disposed on a surface of the tab 72 such that the locking rib 84 extends away from the side wall 50. The locking rib 84 is configured to engage with an attachment feature of the lid 56 to prevent disengagement of the lid 56 and the device housing 42. In this exemplary embodiment, the locking rib 84 is integral with the locking member 48. In certain other embodiments, the locking rib 84 may be individually fabricated and coupled to the locking member 48 using a suitable coupling mechanism (e.g., adhesive). In the illustrated embodiment, the attachment feature of the lid 56 includes a receiving slot formed on a mating surface of the lid 56. Once the locking member 48 secures the printed circuit board 44 with the device housing 42, the locking rib 84 is engaged with the receiving slot of the lid 56. Engagement of the locking rib 84 with the receiving slot of the lid 56 may prevent any accidental disengagement of the tab 72 and the printed circuit board 44.

In the illustrated embodiment, the device housing 42 further includes another locking member 86 on the side wall 54 opposite to the side wall 50. As with the locking member 48, the locking member 86 is configured to flex about one end of the locking member 86 to engage with an extension 88 of the printed circuit board 44. Moreover, the locking member 86 includes a locking rib 90 disposed on an upper portion of the locking member 86 to engage with a corresponding attachment feature on the mating surface of the lid 56 to prevent disengagement of the device housing 42 and the lid 56.

Figure 5:
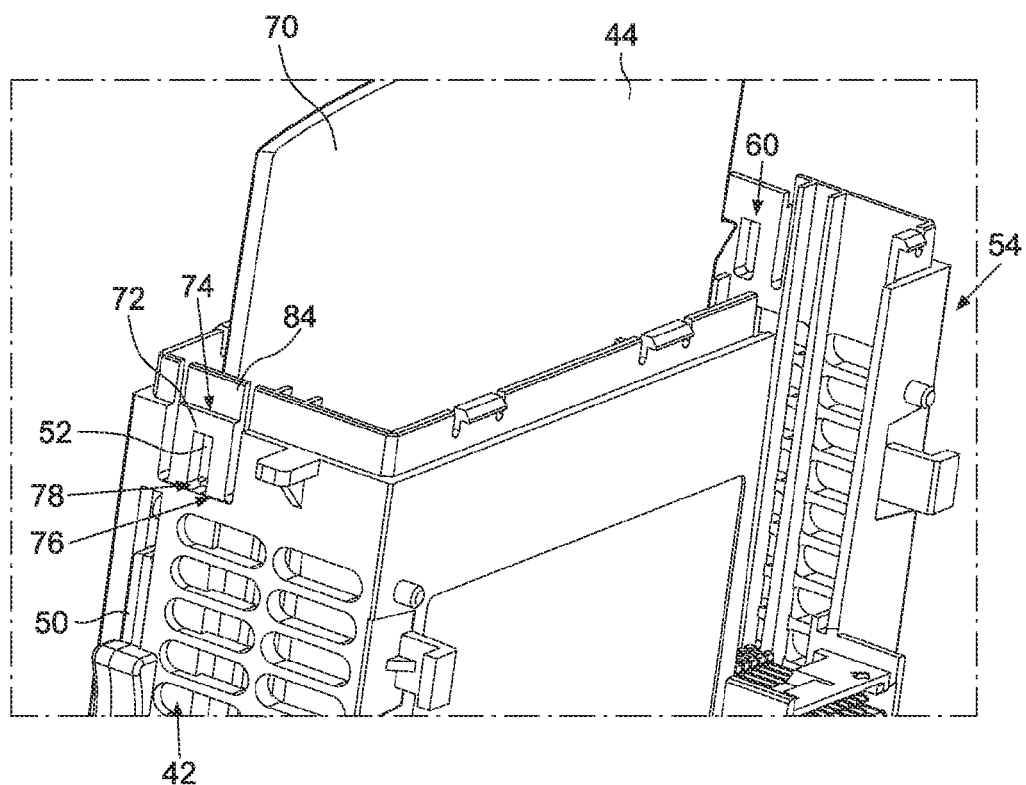
FIG. 5 illustrates engagement of the printed circuit board with the device housing in accordance with aspects of the present technique.

FIG. 5 illustrates engagement of the printed circuit board 44 with the device housing 42 in accordance with aspects of the present technique. In operation, the printed circuit board 44 is slidably inserted within the cavity 60 of the device housing 42 through an opening in a top of the housing 42. Further, the attachment feature 52, which is cantilevered from a side of the printed circuit board 44, is secured with the tab 72, which is cantilevered from the side wall 50 of the device housing 42. Securing the attachment feature 52 with the tab 72 includes flexing the tab 72 out by sliding the printed circuit board 44 into the cavity 60 such that the attachment feature 52 presses against an upper portion of the tab 72 as it slides along the tab 72 until the attachment feature 52 slides past the upper portion of the tab 72 and engages with the opening 78 in the tab 72.

In the illustrated embodiment, the attachment feature 52 includes an extension of the substrate 70 of the printed circuit board. In certain embodiments, the shape and size of the attachment feature 52 may be selected to facilitate the engagement of the printed circuit board 44 with the device housing 42. For example, in one embodiment, the attachment feature 52 includes an angled protrusion with an angle that facilitates gradual displacement of the tab 72 when slidably engaging the attachment feature 52 and the tab 72. Moreover, the size of the tab may be designed appropriately to engage the attachment feature 52.

It should be noted that a plurality of such locking members 48 and corresponding attachment features may be disposed on the device housing 42 and the printed circuit board 44 respectively. The number of such structures may be based upon the size of the printed circuit board, material of the printed circuit board, material of the locking members and so forth. The locking member 48 facilitates easy assembly and disassembly of the printed circuit board 44 and the device housing 42. Indeed, present embodiments enable a user to insert the printed circuit board 44 into the device housing 42 without tools, and remove the printed circuit board 44 from the device housing 42 without tools. By pressing the tab 72 toward the central portion of the device housing 42, the device housing 42 may be disengaged from the lid 56. Further, by pulling the tab 72 away from the central portion of the device housing 42, the tab 72 may be disengaged from the printed circuit board 44. The acts of sliding the lid 56 onto the device housing 42 and sliding the printed circuit board 44 into the device housing may act to engage the respective features with the tab 72, and, thus, the device housing 42.

Figure 6:
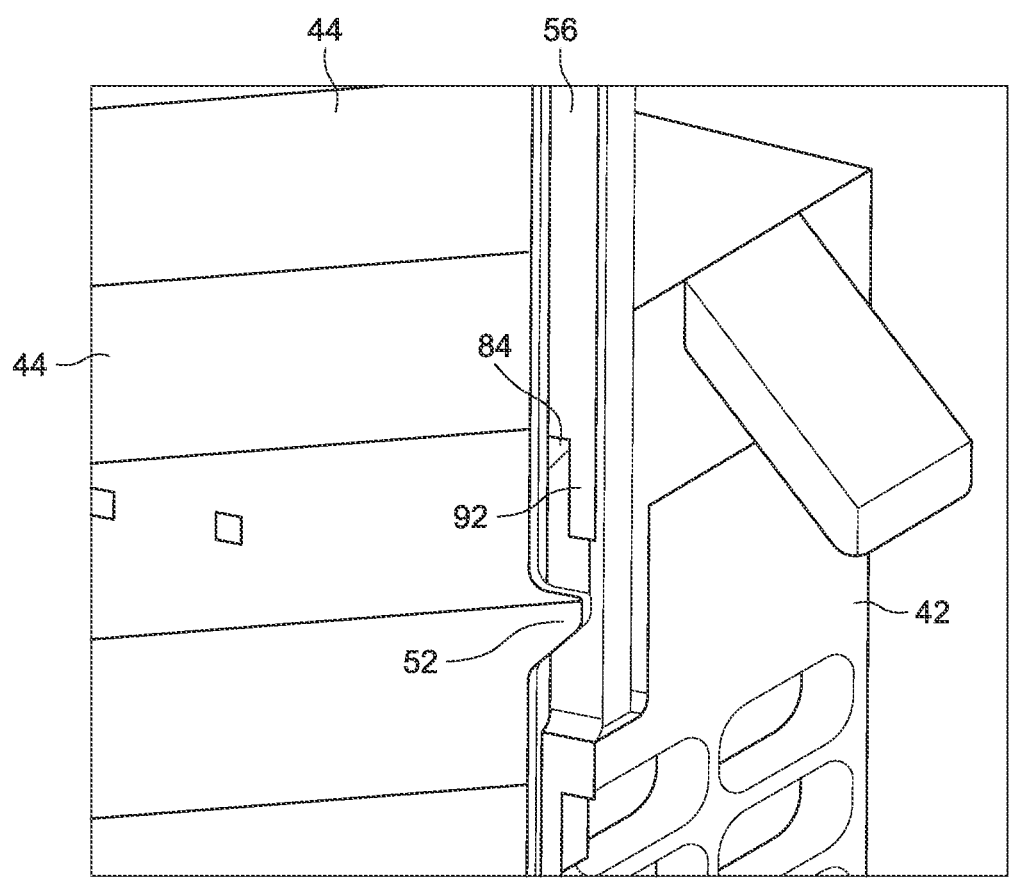
FIG. 6 illustrates engagement of a locking rib of a device housing with an attachment feature of a lid of the module of FIG. 2 in accordance with aspects of the present technique.

FIG. 6 illustrates engagement of the locking rib 84 with an attachment feature 92 of the lid 56 of the module 40 of FIG. 2. In the illustrated embodiment, the locking rib 84 engages with a receiving slot 92 formed on the lid 56 of the module 40. The receiving slot 92 is formed on a mating surface of the lid 56 and is designed to engage with the locking rib 84 of the device housing 42. In the illustrated embodiment, the locking rib slides into the receiving slot 92 and engages with the receiving slot 92 to prevent any accidental opening of the lid 56. In this exemplary embodiment, the locking rib 84 extends from an upper portion of the tab 72 of the locking member 48. In this exemplary embodiment, the width of the locking rib 84 is substantially the same as the width of the tab 72 of the locking member 48. The length of the locking rib 84 is appropriately selected to prevent the disengagement of the lid 56 and the device housing 42. As will be appreciated by one skilled in the art, a variety of shapes and engagement mechanisms may be envisaged to engage the locking rib 84 with the lid 56.

The various aspects of the structures described hereinabove may be used for securing printed circuit boards within device housings, such as those typically found in industrial automation and control systems. As described above, the technique utilizes one or more locking members to secure the printed circuit board and the device housing. Moreover, locking ribs are employed to prevent disengagement of the printed circuit board and the lid of the device housing.

Advantageously, the locking members facilitate easy assembly and disassembly of the printed circuit board while preventing any damage to the device housing during the assembly process. Furthermore, the locking ribs prevent accidental opening of the locking members. As will be appreciated by those skilled in the art, the above described implementations may be appropriately scaled and/or reinforced based upon the size of the printed circuit board.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electronic component and housing interlocking system, comprising:

a device housing configured to hold a printed circuit board, wherein the printed circuit board comprises a projection from a side of the printed circuit board;
a locking member comprising a tab that comprises an extension of a side wall of the device housing with slots on either side to form the tab;
a first end of the tab coupled to the side wall of the device housing and a second end of the tab being free such that the tab is configured to flex about the first end when the printed circuit board is slid into the device housing along the side wall and the projection is pushed against the second end of the tab;
an opening in the tab configured to receive the projection after the projection is slid past the second end such that the tab engages the printed circuit board within the device housing in a locked position; and
a distal portion of the second end of the tab positioned at an opening of the device housing to engage a lid when the lid is coupled with the device housing.

2. The system of claim 1, wherein the projection comprises an extension of a substrate of the printed circuit board.

3. The system of claim 1, wherein the device housing comprises a cavity formed by four side walls and a base, and wherein the opening into the device housing is configured to slideably receive the printed circuit board such that the projection initially presses against the second end of the tab.

4. The system of claim 1, comprising an additional locking member coupled on an opposite side wall to the side wall.

5. The system of claim 1, comprising the lid configured to couple with the device housing such that the lid and the device housing enclose the printed circuit board when the printed circuit board is positioned within the device housing.

6. The system of claim 1, comprising a locking rib extending from the second end of the tab, wherein the locking rib is configured to engage with an attachment feature of the lid.

7. The system of claim 6, wherein the attachment feature comprises a receiving slot in alignment with a length of the tab extending from the first end to the second end, wherein the attachment feature is formed on a mating surface of the lid.

8. The system of claim 6, wherein the locking rib is disposed on a surface of the tab such that the locking rib extends away from the side wall.

9. The system of claim 1, wherein the locking member comprises nylon, polycarbonate, stainless steel, or combinations thereof.

10. The system of claim 1, comprising the lid, wherein when the locking member is engaged with the lid, the lid blocks the locking member from flexing outward from the housing.

11. An electronic device system, comprising:
a device housing;
a printed circuit board within and extending along a length of the device housing, wherein the printed circuit board comprises a first extension from a first edge of the printed circuit board and a second extension from a second edge of the printed circuit board;
a first locking member disposed on a first side wall and a second locking member disposed on a second side wall of the device housing, wherein the first and second locking members are configured to bend about one end to engage with the first and second extensions, respectively;
a first opening in the first locking member configured to receive the first extension;
a second opening in the second locking member configured to receive the second extension; and
a free end of the first locking member and a free end of the second locking member, wherein the first and second free ends are configured to engage a lid of the device housing.

12. The system of claim 11, comprising a locking rib disposed on an upper portion of each of the first and second locking members, wherein the locking rib is configured to engage with a corresponding second attachment feature of the lid.

13. The system of claim 11, wherein the first and second extensions each comprise an integral portion of the printed circuit board cantilevered from a body of the printed circuit board.

14. The system of claim 11, comprising gaps between each of the first and second locking members and adjacent edges of the device housing.

15. The system of claim 13, wherein the locking rib is integral with the locking member.

16. A method of securing a printed circuit board to a device housing, the method comprising:
slidably inserting the printed circuit board within the housing through an opening in a top of the housing;
securing an attachment feature cantilevered from a side of the printed circuit board with a tab cantilevered from a side wall of the device housing by flexing the tab out as a result of pressing the attachment feature against an upper portion of the tab until the attachment feature slides past the upper portion and engages with an opening in the tab; and
enclosing the printed circuit board with a lid and the housing by coupling the lid to the housing, wherein coupling the lid to the housing comprises engaging the lid with a distal end of the upper portion of the tab.

17. The method of claim 16, comprising engaging a locking rib extending from an upper portion of the tab with a corresponding second attachment feature of a lid.

18. The method of claim 16, comprising securing a plurality of attachment features with a plurality of tabs.

19. The method of claim 16, wherein securing the attachment feature with the tab comprises pushing open a snap-lock and aligning the attachment feature within a cavity of the snap-lock in a locked position.

20. The method of claim 16, wherein the attachment feature comprises an angled protrusion with an angle that facilitates gradual displacement of the tab when slidably engaging the attachment feature and the tab.

21. The system of claim 11, comprising the lid, wherein, when the first and second free ends are engaged with the lid, the lid blocks the first and second locking members from flexing outward from the housing.

22. The system of claim 21, wherein the first and second locking members are configured to disengage from the lid when the first and second locking members are flexed inward relative to the housing.

* * * * *